United States Patent
Macri et al.

(10) Patent No.: US 8,429,356 B2
(45) Date of Patent: Apr. 23, 2013

(54) WRITE DATA MASK METHOD AND SYSTEM

(75) Inventors: Joseph D. Macri, Markham (CA); Stephen Morein, Markham (CA); Ming-Ju E. Lee, Markham (CA); Lin Chen, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 566 days.

(21) Appl. No.: 11/359,809

(22) Filed: Feb. 22, 2006

(65) Prior Publication Data

US 2007/0101073 A1 May 3, 2007

Related U.S. Application Data

(60) Provisional application No. 60/733,280, filed on Nov. 2, 2005, provisional application No. 60/735,731, filed on Nov. 10, 2005.

(51) Int. Cl.
*G06F 13/00* (2006.01)

(52) U.S. Cl.
USPC ............... 711/154; 711/104; 711/105; 711/5; 711/155

(58) Field of Classification Search .................. 711/154, 711/104, 105, 5, 155
See application file for complete search history.

(56) References Cited

U.S. PATENT DOCUMENTS

| | | | |
|---|---|---|---|
| 6,101,579 A | 8/2000 | Randolph | |
| 6,347,063 B1 * | 2/2002 | Dosaka et al. | 365/189.17 |
| 6,493,789 B2 | 12/2002 | Ware et al. | |
| 6,496,897 B2 | 12/2002 | Ware et al. | |
| 7,478,205 B1 * | 1/2009 | Hwang et al. | 711/152 |
| 2002/0112070 A1 * | 8/2002 | Ellerbrock et al. | 709/238 |
| 2003/0012229 A1 * | 1/2003 | Braun | 370/536 |
| 2003/0099238 A1 * | 5/2003 | Payne et al. | 370/394 |
| 2003/0156465 A1 | 8/2003 | Laberge | |
| 2004/0162934 A1 * | 8/2004 | LaBerge | 711/105 |
| 2004/0165446 A1 * | 8/2004 | Riesenman et al. | 365/189.01 |
| 2005/0080983 A1 * | 4/2005 | Chung | 711/100 |
| 2005/0213681 A1 * | 9/2005 | Nakajima | 375/265 |

OTHER PUBLICATIONS

Form PCT/ISA/220, "PCT Notification of Transmittal of the International Search Report and the Written Opinion of the International Searching Authority, or the Declaration," 1 pg.
Form PCT/ISA/210, "PCT International Search Report," 3 pgs.
Form PCT/ISA/237, "PCT Written Opinion of the International Searching Authority," 5 pgs.

* cited by examiner

*Primary Examiner* — Mardochee Chery
(74) *Attorney, Agent, or Firm* — Volpe and Koenig P.C.

(57) ABSTRACT

A method and system for performing byte-writes are described, where byte-writes involve writing only particular bytes of a multiple byte write operation. Embodiments include mask data that indicates which bytes are to be written in a byte-write operation. No dedicated mask pin(s) or dedicated mask line(s) are used. In one embodiment, the mask data is transmitted on data lines and store in response to a write_mask command. In one embodiment, the mask data is transmitted as part of the write command.

24 Claims, 5 Drawing Sheets

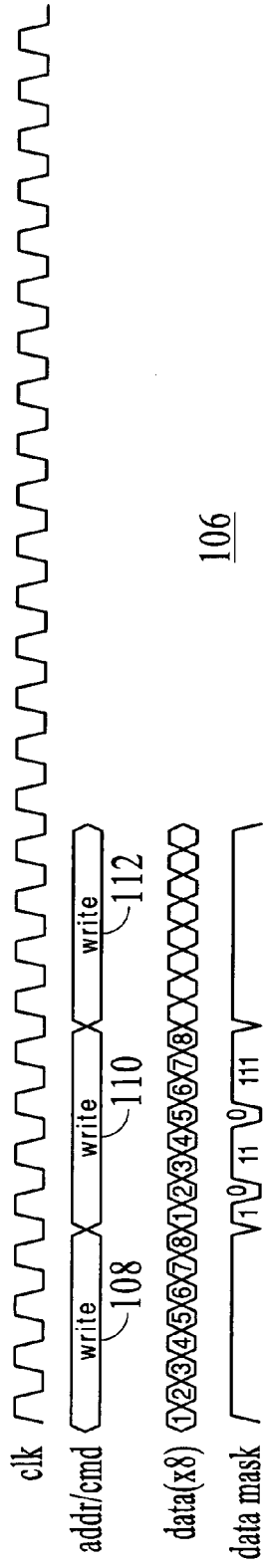
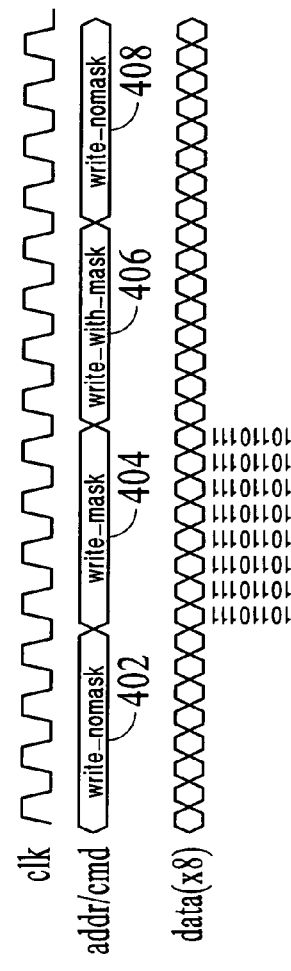

500

700

WRITE DATA MASK METHOD AND SYSTEM

RELATED APPLICATIONS

This application claims the benefit of U.S. provisional patent application Ser. No. 60/733,280, filed Nov. 2, 2005, entitled Error Detection in High-Speed Asymmetric Interfaces, and further claims the benefit of U.S. provisional patent application Ser. No. 60/735,731, filed Nov. 10, 2005, also entitled Error Detection in High-Speed Asymmetric Interfaces. Both of the foregoing applications are incorporated by reference in their entirety herein.

TECHNICAL FIELD

The invention is in the field of data transfer in computer and other digital systems.

BACKGROUND

As computer and other digital systems become more complex and more capable, methods and hardware to enhance the transfer of data between system components or elements continually evolve. Data to be transferred includes digital signals representing data, commands, addresses, or any other information. System components or elements can include different functional hardware blocks on a single integrated circuit (IC), or on different ICs. The different ICs may or may not be on the same printed circuit board (PCB). System components typically include an input/output (I/O) interface specifically designed to receive data from other system components and to transmit data to other system components.

One consistent trend as computing systems become more capable is an increase in the amount of data to be transferred per time period. Some applications that require high data rates include game consoles, high definition television (HDTV), personal computers (PCs) main memory, graphics processors, and various consumer devices not already mentioned. In response to the demand for increased data rates, double data rate (DDR) standards have been developed to standardize the behavior of hardware and software using high data rates. Several generations of graphics DDR (GDDR) standards have been developed specifically for graphics processing and video processing, which typically demand the capability to transfer and process very large amounts of data.

A conventional DDR dynamic random access memory (DRAM) protocol specifies a 256-bit write command according to which 256 bits are transferred as bytes over a 32-bit interface and written in response to a single write command. In some instances, it is necessary to write only a portion of the 256 bits (some but not all of the bytes). This will be referred to as a byte-write operation herein. One conventional byte-write method is to read the 256 bits that are in the DRAM, modify the portion to be changed, and write all of the 256 bits back. This method is commonly used in central processing units (CPUs), and is referred to as a read-modify-write operation. Unfortunately, for high-speed applications, such as graphics applications, read-modify-write operations are both too slow and too complex to implement. One reason is that graphics processors often use a complex operation reordering schemes in order to optimize the memory interface. So historically DRAMs have instead implemented a data mask which is transmitted on an additional, dedicated data mask signal pin for every 8-bit byte. The mask signal on the data mask pins is a multi-bit signal, and each bit indicates whether a corresponding byte should be written or not. This data mask method is referred to in existing DRAM specifications. One disadvantage of this method is it results in one extra pin for every eight data bit pins, thus increasing the pin count.

In addition, the existing data mask method in existing DRAM specifications is not applicable in high speed interfaces which are susceptible to data bit errors. One reason is that the errors on the data mask pins are fatal. This is due to the fact that an error on the data mask pin may result in a byte write that was not intended. The data in that byte would be destroyed (overwritten) and could not be retried.

FIG. 1A is a block diagram of components of a prior art digital system 100. The components include a processor 102 and a memory component 104. The processor 102 controls the memory component 104 by communicating over an interface that includes address/command lines, data lines, and separate, dedicated data mask lines. The memory component 100 is a DDR memory that communicates with the processor 102 over a DDR interface.

FIG. 1B is a timing diagram illustrating a write operation 106 with a data mask, as performed by the prior art components of FIG. 1A. In this illustration, the interface is a 64-bit interface. 64 bits are transmitted in a single operation in eight bursts. The top waveform is the clock (CLK) waveform. The waveform below the CLK waveform shows the commands on the address/command lines. Three write commands are shown, write 108, write 110 and write 112. The data waveform is shown below the address/command waveform. In each of the valid data periods labeled 1-8, eight bits of data are transmitted. A data mask waveform is shown below the data waveform. The data mask waveform indicates the values being transmitted on the data mask lines. For write 108, the data mask line is high during the entire write. In this illustration, a high data mask bit, or a 1 logic level on a data mask line, indicates that the corresponding byte is to be written. So, for write 108, all of the bytes 108 are to be written.

Write 110 differs from write 108. Write 110 is a byte-write in which only particular bytes of the eight bytes are to be written. Referring to the data mask waveform for write 110, it can be seen that the data mask has a value of 10110111, and bytes 1, 3, 4, 6, 7, and 8 are to be written. Therefore, data mask pins and lines are required to be available for each write operation, even if byte-write operations make up a small percentage of write operations, as is often the case in many modern applications.

BRIEF DESCRIPTION OF THE DRAWINGS

FIG. 1B is a timing diagram illustrating a write operation with a data mask, as performed by the prior art components of FIG. 1A.

FIG. 4 is a timing diagram illustrating a write operation with a data mask, as in FIG. 3, according to an embodiment.

Figure 1A:
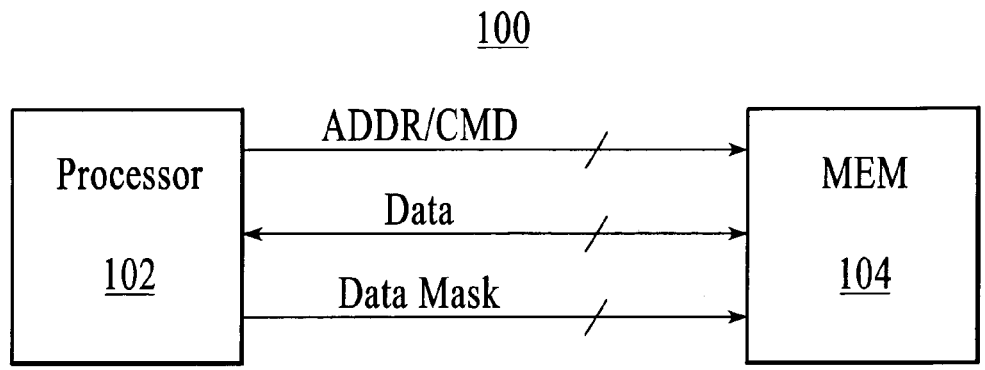
FIG. 1A is a block diagram of components of a prior art digital system.

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

Embodiments of a write data mask method and system are described herein. A data mask indicates which bytes of a multiple byte data transmission over a high-speed interface are to be written in a byte-write operation. In one embodiment, the data mask is stored in a register. In one embodiment, the data mask is transmitted over data lines of the interface for storage. In another embodiment, the data mask is transmitted over address/command lines of the interface as a portion of a write command. The embodiments described eliminate data mask pins and data mask lines.

Figure 2:
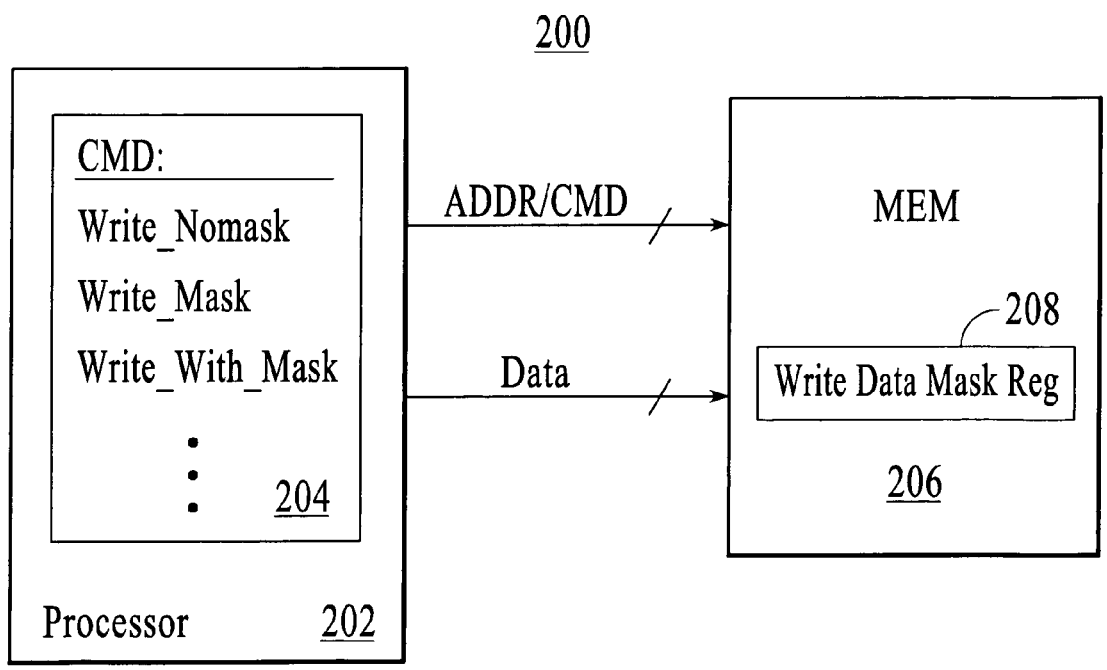
FIG. 2 is a block diagram of components of a digital system, according to an embodiment.

FIG. 2 is a block diagram of components 200 of a digital system, according to an embodiment. The components 200 include a processor 202 and a memory 206. In an embodiment, the processor 202 includes a memory controller functionality for communicating with the memory 206. In embodiments that are described herein, the memory 206 is a DDR memory, including a graphics DDR (GDDR) memory, but the embodiments are not so limited.

The processor 202 includes a set of commands 204 for the memory controller functionality, including a write_nomask command, a write_mask command, and a write_with_mask command, as further described below. The memory 206 includes a write data mask register 208 for storing a write data mask (also referred to herein as a data mask). In the embodiments described, the interface (which includes the address/command lines and the data lines as shown) is a 256-bit interface that transmits data in bursts of 8 bits over 32 pins, but the embodiments are applicable to any comparable configuration.

Figure 3:
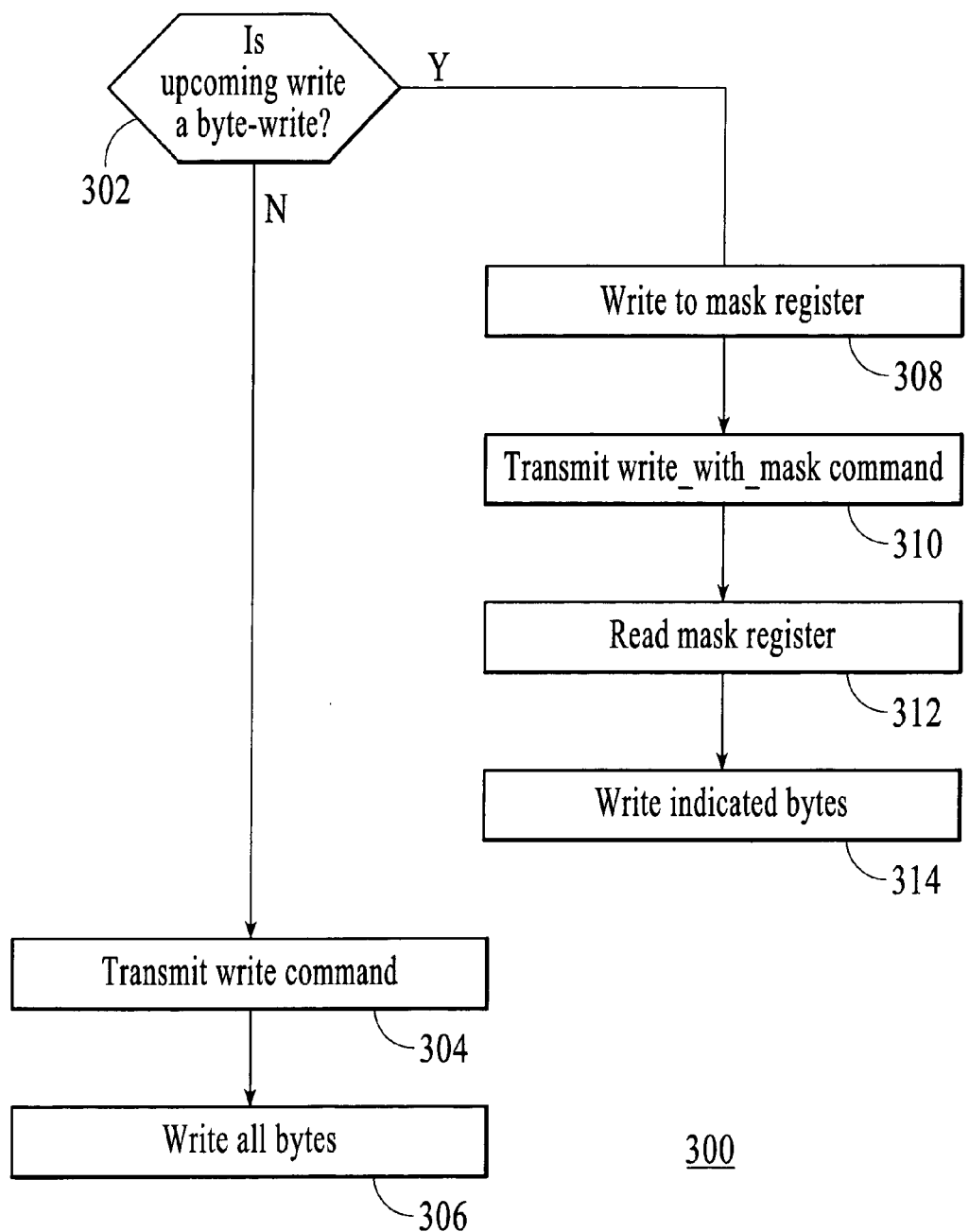
FIG. 3 is a flow diagram of a method for performing byte writes as performed by the components of FIG. 2, according to another embodiment.

FIG. 3 is a flow diagram of a method 300 for performing byte writes as performed by the components of FIG. 2, according to another embodiment. As described herein, a byte-write is a write operation in which only particular ones of the bytes transferred are to be written. At 302, it is determined whether the upcoming operation is a byte-write operation. If the operation is not a byte-write operation, a write command is transmitted over the interface from the processor to the memory at 304, and all bytes are written to the memory at 306.

If the operation is a byte-write operation, a data mask is written to the write data mask register at 308. The data mask includes one bit for each byte in a write data transaction. In embodiments in which the interface is a 256-bit interface, for example, the data mask is 32 bits. A write_with_mask command is transmitted at 310. This command indicates that the data mask is to be referred to for determining which bytes to write. The write data mask register is read at 312, and the indicated bytes are written to the memory at 314.

FIG. 4 is a timing diagram illustrating a write operation with a data mask, as in FIG. 3, according to an embodiment. In the illustration of FIG. 4, for ease of illustration, the interface is a 64-bit interface rather than a 256-bit interface. The waveform of FIG. 4 is a clock (CLK) waveform. Below the CLK waveform is an address/command waveform showing particular commands being transmitted. A write_nomask command 402, a write_mask command 404, a write_with_mask command 406, and another write_nomask command 408 are shown. Below the address/command waveform is a data waveform showing the periods of valid data corresponding to the commands on the address/command waveform. With the write_nomask command 402, data to be written is transmitted on the data lines. With the write_mask command 404, data mask that has the value 10110111 is transmitted in each burst as shown. In this example, it shows that the same data mask value is transmitted in 8 consecutive bursts, but embodiments are not limited to 8 bursts. The following command is the write_with_mask command 406, during which the bytes corresponding to the 1s of the data mask are written to the memory. The bytes corresponding to the 0s of the data mask are not written. Following the write_with_mask command 406 is the other write_nomask command 408.

Figure 5:
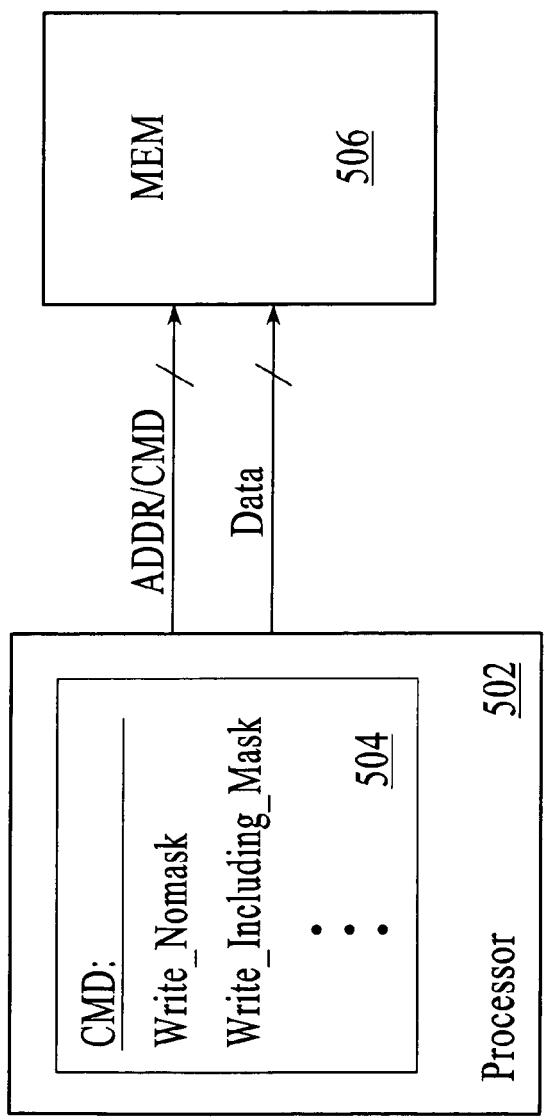
FIG. 5 is a block diagram of components of a digital system, according to an embodiment.

FIG. 5 is a block diagram of components 500 of a digital system, according to another embodiment. The components 500 include a processor 502 and a memory 506. In an embodiment, the processor 502 includes a memory controller functionality for communicating with the memory 506. In embodiments that are described herein, the memory 506 is a DDR memory, including a graphics DDR (GDDR) memory, but the invention is not so limited.

The processor 502 includes a set of commands 504 for the memory controller functionality, including a write_nomask command, and a write_including_mask command, as further described below. In the embodiments described, the interface (which includes the address/command lines and the data lines as shown) is a 256-bit interface that transmits data in bursts of 8 bits over 32 pins, but the embodiments are applicable to any comparable configuration.

Figure 6:
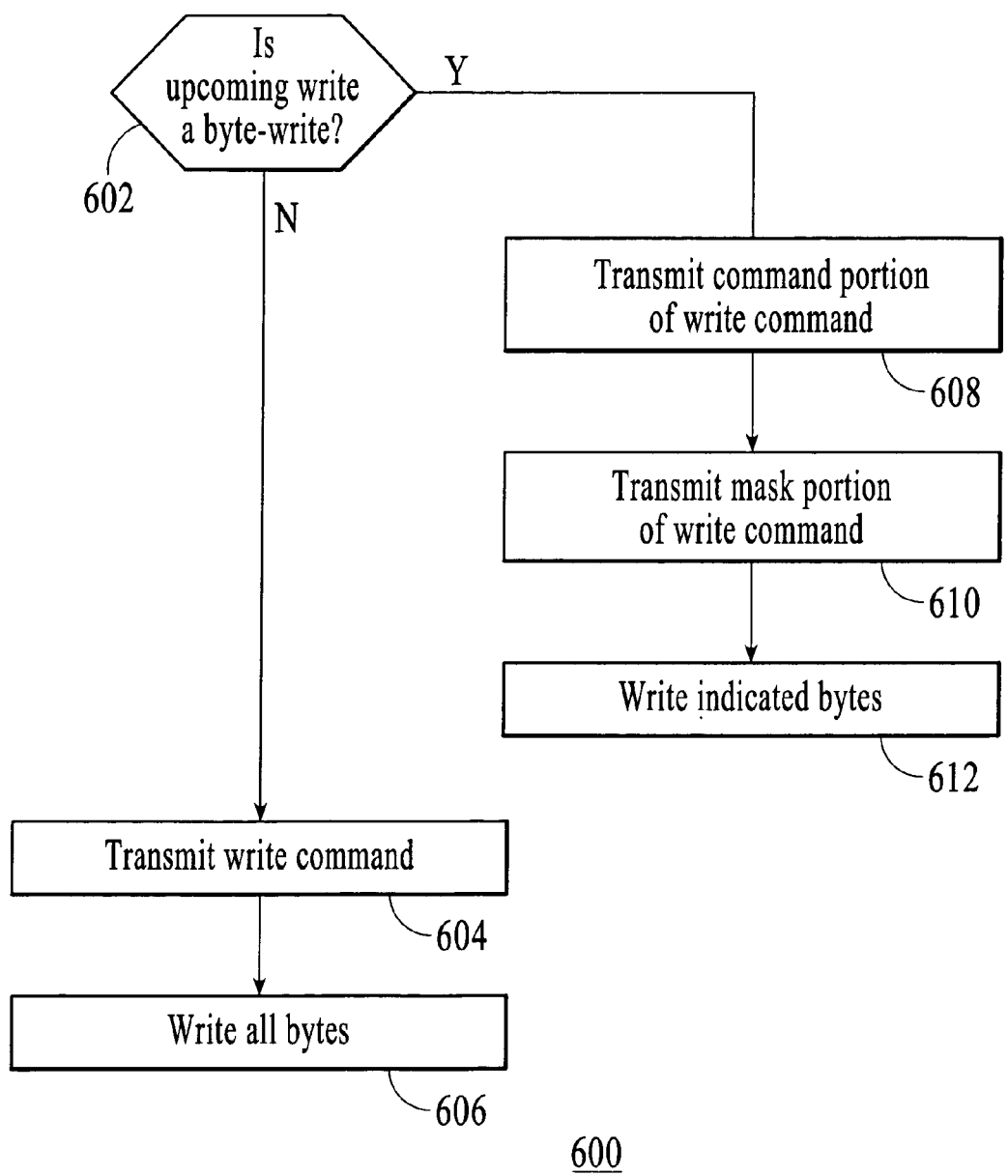
FIG. 6 is a flow diagram of a method for performing byte writes as performed by the components of FIG. 5, according to an embodiment.

FIG. 6 is a flow diagram of a method for performing byte writes as performed by the components of FIG. 5, according to an embodiment. At 602 it is determined whether an upcoming write operation is a byte-write operation. If the upcoming operation is not a byte-write operation, a write command is transmitted at 604, and all bytes are written at 606. If the upcoming operation is a byte-write operation, a command portion of a write command is transmitted at 608. A mask portion of the same write command is transmitted at 610. In various embodiments, the order of 608 and 610 may be reversed. In an embodiment, the single write command is a write_including_mask command that has two parts, a command part and a data mask part. At 612, the bytes indicated by the data mask part of the write_including_mask command are written to the memory.

Figure 7:
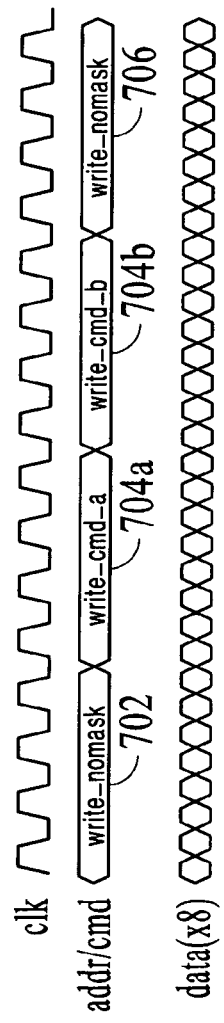
FIG. 7 is a timing diagram illustrating a write operation with a data mask, as in FIG. 6, according to an embodiment.

FIG. 7 is a timing diagram illustrating a write operation 700 with a data mask, as in FIG. 6, according to an embodiment. In the illustration of FIG. 7, for ease of illustration, the interface is a 64-bit interface rather than a 256-bit interface. The waveform at the top of FIG. 7 is a clock (CLK) waveform. Below the CLK waveform is an address/command waveform showing particular commands being transmitted. A write_nomask command 702, a write_cmd_a 704A, a write_cmd_b 704B, and another write_nomask command 706 are shown. In an embodiment, the write_cmd_a 704A and the write_cmd_b 704B make up one write_including_ mask command 704. Below the address/command waveform is a data waveform showing the periods of valid data corresponding to the commands on the address/command waveform. The write_cmd_a 704A is the command portion of the write_including_mask command. The write_cmd_b 704B is another portion of the write_including_mask command that includes the data mask. With the write_cmd_b 704B, a data mask transmitted on the address command lines, and the bytes corresponding to the 1s of the data mask are written to the memory. The bytes corresponding to the 0s of the data mask are not written. Following the write_cmd_b 704B is another write_nomask command 706.

High-speed interfaces to which the described embodiments are applicable are usually more susceptible to data bit errors than slower interfaces. Data bit errors may be avoided in several ways. However, conventional methods such as ECC are not practical for DDR interfaces. One reason is that in many DDR applications, the most likely errors are multi-bit errors (affecting more than one bit in a word) that are due to noise or timing issues. ECC is not well adapted to detect and correct such multi-bit errors.

Another reason conventional methods such as ECC are not practical for DDR interfaces is that ECC requires extra pins for parity bits. Additional pins for error detection may also be multiplied further when one system component, such as a processor, must interface with many other components, necessitating error detection and correction for each data path.

In one embodiment, bit errors in the data mask are minimized or eliminated by sampling the mask bits toward the middle of the transmission period. Referring to FIG. 4, for example, it can be seen that the entire transmission of 64 bits is not required to transmit the 8 bits of the mask. Therefore, sampling is done when the transmission lines have stabilized and data bit errors caused by physical phenomena are least likely to occur. This is an improvement over the traditional ECC methods and also does not require dedicated ECC pins.

In another embodiment, data bit errors in the data mask are minimized or eliminated by storing a signature for the processor and a signature for the memory. The signatures are compared to determine whether a command was executed accurately. If there was an error in executing a command, the command is retried. To concentrate more complex logic in the processor, rather then in the memory, logic for comparison of the signatures may be present in the memory, but embodiments are not so limited. Therefore, the memory is not required to have additional logic present to support this signature capability.

Aspects of the embodiments described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices, and standard cell-based devices, as well as application specific integrated circuits (ASICs) and fully custom integrated circuits. Some other possibilities for implementing aspects of the embodiments include microcontrollers with memory (such as electronically erasable programmable read only memory (EEPROM)), embedded microprocessors, firmware, software, etc. Furthermore, aspects of the embodiments may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies such as emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word, any of the items in the list, all of the items in the list, and any combination of the items in the list.

The above description of illustrated embodiments of the system and method is not intended to be exhaustive or to limit the invention to the precise forms disclosed. While specific embodiments of, and examples for, the system and method are described herein for illustrative purposes, various equivalent modifications are possible within the scope of the invention, as those skilled in the relevant art will recognize. The teachings of the disclosure provided herein can be applied to other systems, not only for systems including graphics processing or video processing, as described above. The various operations described may be performed in a very wide variety of architectures and distributed differently than described. In addition, though many configurations are described herein, none are intended to be limiting or exclusive.

In other embodiments, some or all of the hardware and software capability described herein may exist in a printer, a camera, television, a digital versatile disc (DVD) player, a handheld device, a mobile telephone or some other device. The elements and acts of the various embodiments described above can be combined to provide further embodiments. These and other changes can be made to the system and method in light of the above detailed description.

In general, in the following claims, the terms used should not be construed to limit the system and method to the specific embodiments disclosed in the specification and the claims, but should be construed to include any processing systems and methods that operate under the claims. Accordingly, the system and method is not limited by the disclosure, but instead the scope of the method and system is to be determined entirely by the claims.

While certain aspects of the method and system are presented below in certain claim forms, the inventors contemplate the various aspects of the method and system in any number of claim forms. For example, while only one aspect of the system and method may be recited as embodied in computer-readable medium, other aspects may likewise be embodied in computer-readable medium. Accordingly, the inventors reserve the right to add additional claims after filing the application to pursue such additional claim forms for other aspects of the system and method.

What is claimed is:

1. A method, comprising:
    transmitting a data mask comprising a plurality of bits indicating corresponding bytes of multiple bytes of data to be written in a write operation from a first system component to a second system component as a portion of a write command over an address/command line of an interface coupling the first system component and the second system component;
    transmitting the data from the first system component to the second system component over a data line of an interface coupling the first system component with the second system component, wherein the same data is transmitted over the data line in a plurality of consecutive bursts during a time period when the write command is a write mask command; and
    writing particular bytes of the data from the data line into the second system component based on the write command.

2. The method of claim 1, wherein the data mask is transmitted by the first component and stored in the second component to refer to a write to the second component.

3. The method of claim 1, wherein the multiple bytes of data comprise thirty-two bytes of data, and wherein the data mask indicates which of the thirty-two bytes are to be written in response to the write command.

4. The method of claim 1, wherein the data mask is stored in the second component in response to the write_mask command.

5. The method of claim 1, wherein the write command is a write_with_mask command that directs only the indicated bytes to be written.

6. The method of claim 1, wherein the write command is a write_nomask command that directs all of the multiple bytes to be written regardless of the data mask.

7. The method of claim 1, wherein the write_mask command directs the data mask to be stored for reference during the write operation.

8. The method of claim 1, further comprising:
determining whether the write operation is a byte-write operation, wherein only particular bytes of the multiple bytes are to be written in response to the write command;
on a condition that the write operation is a byte-write operation, executing a write_mask command; and
storing the data mask in response to the write_mask command.

9. The method of claim 8, further comprising:
reading the stored data mask; and
writing the particular bytes indicated by the stored data mask.

10. The method of claim 1, further comprising:
determining whether a write operation is a byte-write operation, wherein only particular bytes of the multiple bytes are to be written in response to the write command; and
on a condition that the write operation is a byte-write operation, transmitting the data mask to be read as a portion of the write command.

11. A system comprising:
a memory component;
an interface that includes a data line and an address/command line;
a processor coupled with the memory component through the interface and configured to:
transmit data to be written in the memory component over the data line;
transmit a write command over the address/command line wherein the write command comprises writing only particular bytes of multiple bytes of the data to be written during a write operation; and
transmit a data mask comprising a plurality of bits indicating corresponding bytes of multiple bytes of data to be written in response to the write command as a portion of the write command during a write operation, wherein the same data is transmitted over the data line in a plurality of consecutive bursts during a time period when the write command is a write_mask command.

12. The system of claim 11, wherein the data mask is written to the memory component for reference in the write operation in response to the write_mask command.

13. The system of claim 11, wherein the write command is a write_nomask command, in response to which all of the multiple bytes are written to the memory component regardless of the data mask.

14. The system of claim 11, wherein the write command is a write_including_mask command that comprises a write command portion and a data mask portion.

15. A computer-readable medium having instructions stored thereon, that when executed causes a digital processing system to perform a method, the method comprising:
transmitting a data mask comprising a plurality of bits indicating corresponding bytes of multiple bytes of data to be written in a write operation from a first system component to a second system component as a portion of a write command over an address/command line of an interface coupling the first system component and the second system component;
transmitting the data from the first system component to the second system component over a data line of an interface coupling the first system component with the second system component, wherein the same data is transmitted over the data line in a plurality of consecutive bursts during a time period when the write command is a write mask command; and
writing particular bytes of the data from the data line into the second system component based on the write command.

16. The computer-readable medium of claim 15, wherein the data mask is transmitted by the first component and stored in the second component to refer to a write to the second component.

17. The computer-readable medium of claim 15, wherein the multiple bytes of data comprise thirty-two bytes of data, and wherein the data mask indicates which of the thirty-two bytes are to be written in response to the write command.

18. The computer-readable medium of claim 15, wherein the data mask is stored in the second component in response to the write_mask command.

19. The computer-readable medium of claim 15, wherein the write command is a write_with_mask command that directs only the indicated bytes to be written.

20. The computer-readable medium of claim 15, wherein the write command is a write_nomask command that directs all of the multiple bytes to be written regardless of the data mask.

21. The computer-readable medium of claim 15, wherein the write_mask command directs the data mask to be stored for reference during the write operation.

22. The computer-readable medium of claim 15, wherein the method further comprises:
determining whether the write operation is a byte-write operation, wherein only particular bytes of the multiple bytes are to be written in response to the write command;
the write operation is a byte-write operation, executing a write_mask command; and
storing the data mask that is transmitted on the address/command line in response to the write_mask command.

23. The computer-readable medium of claim 22, wherein the method further comprises:
reading the stored data mask; and
writing the particular bytes indicated by the stored data mask.

24. The computer-readable medium of claim 15, wherein the method further comprises:
determining whether the write operation is a byte-write operation, wherein only particular bytes of the multiple bytes are to be written in response to the write command; and the write operation is a byte-write operation transmitting the data mask to be read as a portion of the write command.

\* \* \* \* \*